(12) United States Patent
Han et al.

(10) Patent No.: US 10,790,443 B2
(45) Date of Patent: Sep. 29, 2020

(54) MEMORY DEVICE

(71) Applicant: TOSHIBA MEMORY CORPORATION, Minato-ku, Tokyo (JP)

(72) Inventors: Yefei Han, Yokkaichi Mie (JP); Tetsu Morooka, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 12 days.

(21) Appl. No.: 15/909,125

(22) Filed: Mar. 1, 2018

(65) Prior Publication Data

US 2019/0088869 A1 Mar. 21, 2019

(30) Foreign Application Priority Data

Sep. 15, 2017 (JP) .................. 2017-178415

(51) Int. Cl.
| | |
|---|---|
| *H01L 45/00* | (2006.01) |
| *H01L 27/24* | (2006.01) |
| *G11C 7/06* | (2006.01) |
| *G11C 13/00* | (2006.01) |
| *G11C 7/12* | (2006.01) |
| *G11C 29/00* | (2006.01) |
| *G11C 29/04* | (2006.01) |

(52) U.S. Cl.
CPC .............. *H01L 45/06* (2013.01); *G11C 7/06* (2013.01); *G11C 13/003* (2013.01); *G11C 13/0007* (2013.01); *G11C 13/0033* (2013.01); *H01L 27/249* (2013.01); *H01L 27/2436* (2013.01); *H01L 27/2481* (2013.01); *H01L 45/08* (2013.01); *H01L 45/1226* (2013.01); *H01L 45/1233* (2013.01); *H01L 45/144* (2013.01); *H01L 45/146* (2013.01); *H01L 45/1608* (2013.01); *G11C 7/12* (2013.01); *G11C 29/04* (2013.01); *G11C 29/70* (2013.01); *G11C 2213/71* (2013.01); *G11C 2213/76* (2013.01); *G11C 2213/78* (2013.01); *G11C 2213/79* (2013.01)

(58) Field of Classification Search
CPC .. H01L 45/06; H01L 27/2436; H01L 27/2481
See application file for complete search history.

(56) References Cited

U.S. PATENT DOCUMENTS

| | | | |
|---|---|---|---|
| 9,406,694 B1 | 8/2016 | Ikeno et al. | |
| 2012/0292584 A1* | 11/2012 | Rocklein | H01L 45/08 257/2 |
| 2013/0200331 A1 | 8/2013 | Morikawa et al. | |
| 2016/0336378 A1* | 11/2016 | Ohba | G11C 13/003 |
| 2018/0061492 A1* | 3/2018 | Choi | G11C 13/0028 |

FOREIGN PATENT DOCUMENTS

JP 2016-225364 A 12/2016

* cited by examiner

*Primary Examiner* — Marc Anthony Armand
(74) *Attorney, Agent, or Firm* — Foley & Lardner LLP

(57) ABSTRACT

A memory device includes a first conductive layer and a second conductive layer. A variable resistance layer is disposed between the first conductive layer and the second conductive layer and includes a first layer containing a semiconductor or a first metal oxide, and a second layer containing a second metal oxide. A phase-change layer is disposed either between the first conductive layer and the variable resistance layer or between the second conductive layer and the variable resistance layer.

6 Claims, 15 Drawing Sheets

MEMORY DEVICE

CROSS-REFERENCE TO RELATED APPLICATION

This application claims the benefit of and priority to Japanese Patent Application No. 2017-178415, filed Sep. 15, 2017, the entire contents of which are incorporated herein by reference.

FIELD

Embodiments described herein relate generally to a memory device.

BACKGROUND

In a resistance-change type memory, a current flows by applying a voltage to a variable resistance layer of a memory cell to make a transition between a high resistance state and a low resistance state. For example, when the high resistance state is defined as data "0" and the low resistance state is defined as data "1", the memory cell can store 1-bit data of "0" and "1". A specific memory cell may break down due to the repetition transition of the high resistance state and the low resistance state resulting in the memory operation being incapable of being executed, and resulting in causing inferior reliability.

When a specific memory cell breaks down, it is preferable to have a high resistance at a breakdown portion. This is because if the breakdown portion has a low resistance, a leakage current flowing in the breakdown portion causes malfunction of other memory cells.

DETAILED DESCRIPTION

Figure 1:
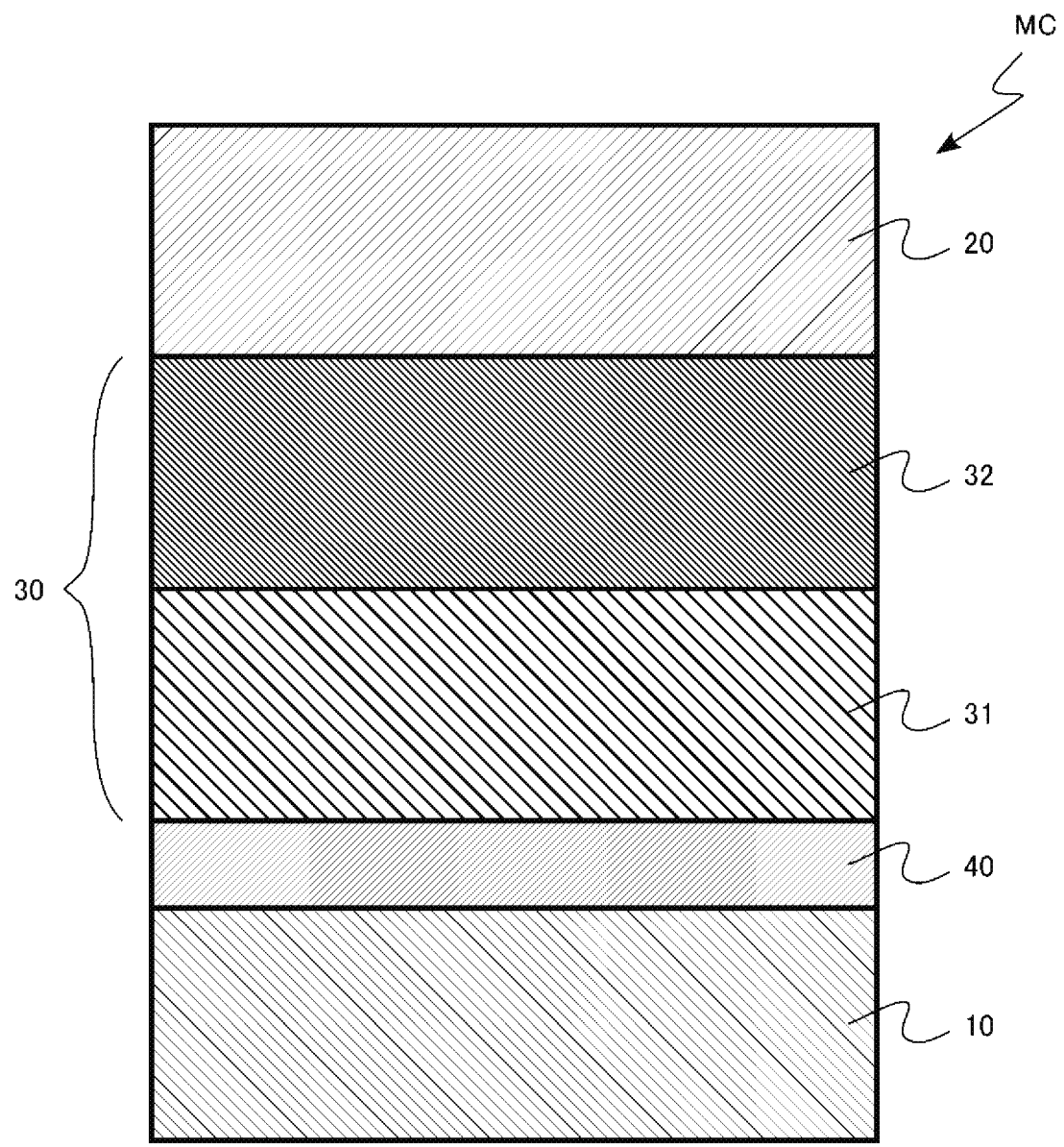
FIG. 1 is a schematic cross-sectional view of a memory cell of a memory device according to a first embodiment.

Embodiments provide a memory device capable of making a breakdown portion of a memory cell with high resistance.

According to one embodiment, a memory device includes: a first conductive layer; a second conductive layer; a variable resistance layer that is provided between the first conductive layer and the second conductive layer and includes a first layer containing a semiconductor or a first metal oxide and a second layer containing a second metal oxide; and a phase-change layer that is provided either between the first conductive layer and the variable resistance layer or between the second conductive layer and the variable resistance layer.

Hereafter, embodiments of the disclosure will be described with reference to the accompanying drawings. In the following description, the same or similar components will be represented by like reference numerals, and the descriptions of components which have been described once will be properly omitted.

In the specification, the terms such as 'upper' and 'lower' are used for convenience of description. The terms such as 'upper' and 'lower' only indicate a relative positional relation in the drawings, and do not define a positional relation in the direction of gravity.

The qualitative analysis and quantitative analysis for chemical compositions of members constituting a memory device in the specification can be performed through SIMS (Secondary Ion Mass Spectroscopy) and EDX (Energy Dispersive X-ray Spectroscopy), for example. Moreover, the thicknesses of members constituting a semiconductor device and a distance between members can be measured through a TEM (Transmission Electron Microscope). Furthermore, whether a member constituting the memory device is amorphous can be determined by checking whether grains are present in the member, through observation with the TEM.

Embodiments of memory devices will be described below with reference to the drawings.

First Embodiment

A memory device according to a first embodiment includes: a first conductive layer; a second conductive layer; a variable resistance layer that is provided between the first conductive layer and the second conductive layer and includes a first layer containing a semiconductor or a first metal oxide and a second layer containing a second metal oxide; and a phase-change layer that is provided between the first conductive layer and the variable resistance layer.

Figure 2:
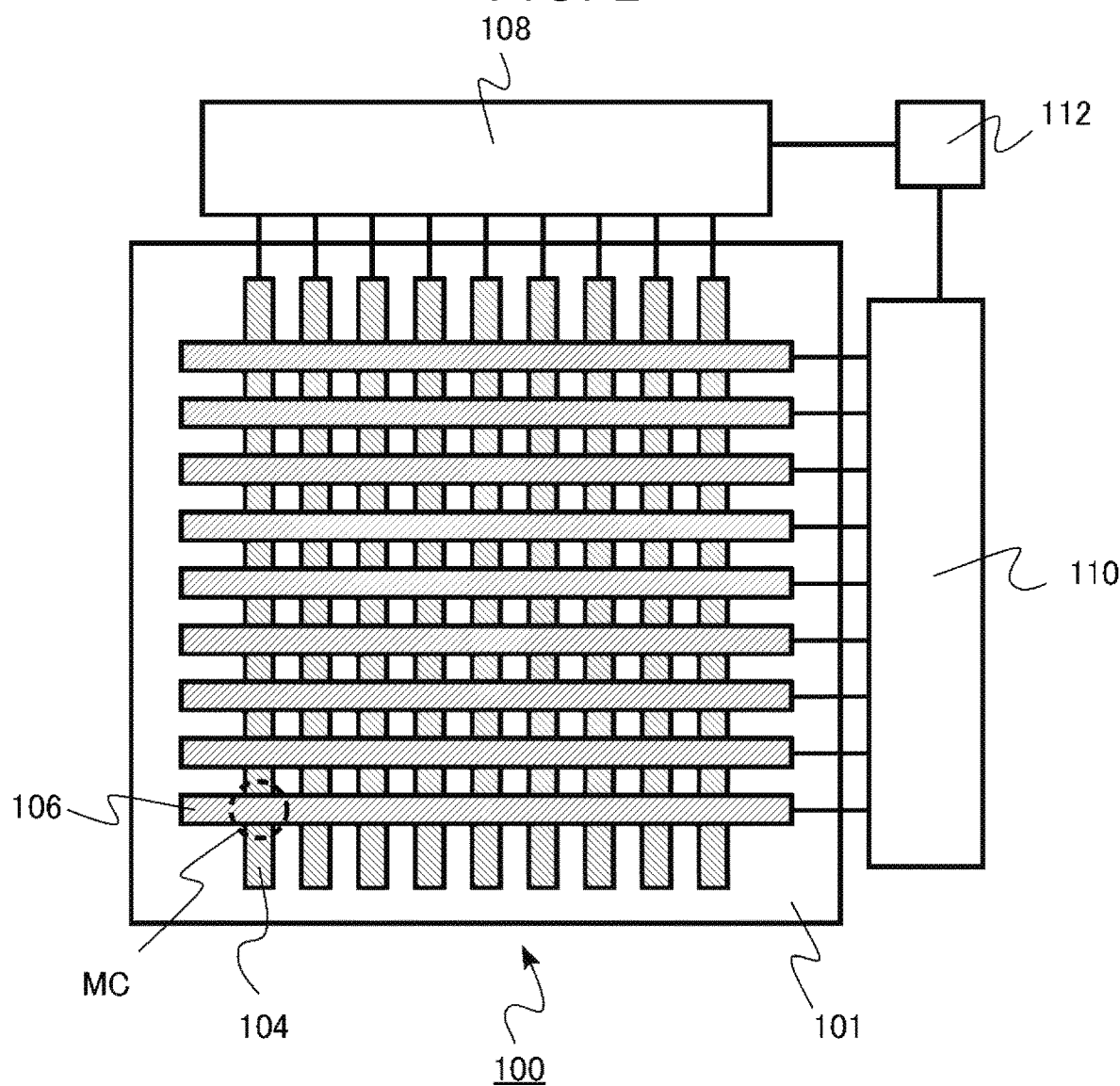
FIG. 2 is a block diagram of the memory device according to the first embodiment.

FIG. 1 is a schematic cross-sectional view of a memory cell MC of the memory device according to the first embodiment. FIG. 2 is a block diagram illustrating a memory cell array 100 and peripheral circuits in the memory device according to the first embodiment. FIG. 1 illustrates a cross-section of one memory cell MC indicated by a dotted circle in the memory cell array 100 of FIG. 2.

The memory cell array 100 of the memory device according to the first embodiment includes, for example, a plurality of word lines 104 and a plurality of bit lines 106 on a semiconductor substrate 101 with an insulating layer interposed therebetween, the plurality of bit lines 106 intersecting with the plurality of word lines 104. The bit lines 106 are provided at an upper layer of the word lines 104. Around the memory cell array 100, a first control circuit 108, a second control circuit 110, and a sense circuit 112 are provided as the peripheral circuits.

At respective intersections between the word lines 104 and the bit lines 106, a plurality of memory cells MC are provided. The memory device according to the first embodiment is a resistance-change type memory with a cross point structure. The memory cell MC is a two-terminal variable resistance element.

The plurality of word lines 104 are connected to the first control circuit 108, respectively. The plurality of bit lines 106 are connected to the second control circuit 110, respectively. The sense circuit 112 is connected to the first and second control circuits 108 and 110.

The first and second control circuits 108 and 110 have functions of selecting a desired memory cell MC, writing data to the memory cell MC, reading data from the memory cell MC, and erasing the data of the memory cell MC, for example. During the read operation, the data of the memory cell is read as the amount of current flowing between the word line 104 and the bit line 106. The sense circuit 112 has a function of determining the current amount and determining the polarity of the data. For example, the sense circuit 112 determines "0" and "1" of data.

The first control circuit 108, the second control circuit 110, and the sense circuit 112 are configured with electronic circuits using a semiconductor device formed on the semiconductor substrate 101, for example.

As illustrated in FIG. 1, the memory cell MC includes a lower electrode (first conductive layer) 10, an upper electrode (second conductive layer) 20, a variable resistance layer 30, and a phase-change layer 40. The variable resistance layer 30 includes a high resistance layer 31 (first layer) and a low resistance layer 32 (second layer). The phase-change layer 40, the high resistance layer 31, and the low resistance layer 32 are arranged in order from the lower electrode 10 toward the upper electrode 20.

The lower electrode 10 is connected to the word line 104. The lower electrode 10 is formed of a metal. For example, the lower electrode 10 is formed of titanium nitride (TiN) or tungsten (W). The lower electrode 10 itself may serve as the word line 104.

The upper electrode 20 is connected to the bit line 106. The upper electrode 20 is formed of a metal. For example, the upper electrode 20 is formed of titanium nitride (TiN) or tungsten (W). The upper electrode 20 itself may serve as the bit line 106.

The variable resistance layer 30 is provided between the lower electrode 10 and the upper electrode 20. The variable resistance layer 30 includes the high resistance layer 31 (first layer) and the low resistance layer 32 (second layer).

In the variable resistance layer 30, the high resistance layer 31 and the low resistance layer 32 are arranged in order from the lower electrode 10 toward the upper electrode 20. The low resistance layer 32 and the high resistance layer 31 may be arranged in order from the lower electrode 10 toward the upper electrode 20.

A thickness of the variable resistance layer 30 is, for example, 5 nm or more and 25 nm or less. The variable resistance layer 30 may be a film formed by atomic layer deposition (ALD), for example.

The high resistance layer 31 may contain a semiconductor or a first metal oxide. The high resistance layer 31 may contain, for example, an amorphous semiconductor or an amorphous metal oxide.

The high resistance layer 31 may be formed of, for example, the semiconductor. The high resistance layer 31 may contain, for example, silicon, germanium, or, silicon germanide. The high resistance layer 31 may contain, for example, amorphous silicon, amorphous germanium, or amorphous silicon germanide.

The high resistance layer 31 may be formed of, for example, the first metal oxide. The first metal oxide may contain, for example, at least one metal element selected from the group consisting of aluminum (Al), hafnium (Hf), zirconium (Zr), tantalum (Ta), and niobium (Nb). The high resistance layer 31 may be formed of, for example, aluminum oxide, hafnium oxide, zirconium oxide, tantalum oxide, niobium oxide, or a compound thereof.

The high resistance layer 31 may have a thickness, for example, of 1 nm or more and 10 nm or less.

The low resistance layer 32 is provided between the high resistance layer 31 and the upper electrode 20.

The low resistance layer 32 contains a second metal oxide. The second metal oxide may contain, for example, at least one metal element selected from the group consisting of titanium (Ti), niobium (Nb), tantalum (Ta), and tungsten (W). The low resistance layer 32 is formed of, for example, titanium oxide, niobium oxide, tantalum oxide, or tungsten oxide. For example, the second metal oxide is different from the first metal oxide. The low resistance layer 32 may include the same kind of metal oxide as the high resistance layer 31, the metal oxide having different electrical resistance from the high resistance layer 31. For example, the high resistance layer 31 may be formed of amorphous titanium oxide, and the low resistance layer 32 may be formed of crystalline titanium oxide.

The low resistance layer 32 has resistivity lower than that of the high resistance layer 31. At least a part of the low resistance layer 32 may have a crystalline structure. The low resistance layer 32 may have, for example, a polycrystalline structure. The resistivity is lowered by crystallization of the second metal oxide of the low resistance layer 32. The metal oxide of the low resistance layer 32 has a crystallization ratio higher than that of the first metal oxide of the high resistance layer 31. The crystallization ratio of the metal oxide can be measured using, for example, TEM.

The low resistance layer 32 has a thickness of 3 nm or more and 15 nm or less.

When a voltage is applied to the variable resistance layer 30 to pass a current, the variable resistance layer 30 changes into a low resistance state from a high resistance state, or changes into a high resistance state from a low resistance state. The change into the low resistance state from the high resistance state is referred to as a set operation, for example. The change into the high resistance state from the low resistance state is referred to as a reset operation, for example. A voltage applied to the variable resistance layer 30 during the change into the low resistance state from the high resistance state is referred to as a set voltage, and a voltage applied to the variable resistance layer 30 during the change into the high resistance state from the low resistance state is referred to as a reset voltage.

The oxygen deficiency amount (the quantity of oxygen vacancies) in the low resistance layer 32 changes due to the voltage applied to the variable resistance layer 30. As the oxygen deficiency amount in the low resistance layer 32 changes, the conductivity of the variable resistance layer 30 changes. The low resistance layer 32 is a so-called vacancy modulated conductive oxide.

For example, the high resistance state is defined as data "0", and the low resistance state is defined as data "1". The memory cell MC can store 1-bit data of "0" or "1".

The phase-change layer 40 is provided between the lower electrode 10 (first conductive layer) and the variable resistance layer 30. The phase-change layer 40 is provided between the lower electrode 10 and the high resistance layer 31. The phase-change layer 40 is a polycrystalline layer. The phase-change layer 40 may have, for example, a characteristic that it enters an amorphous state by heating at 700° C. or lower and rapid cooling to increase the resistivity. The phase-change layer 40 has a characteristic that the phase thereof changes into an amorphous phase of a high resistance from a polycrystalline phase of a low resistance by heating and rapid cooling.

The phase-change layer 40 may be formed of, for example, a compound containing chalcogen (Group XVI element). The phase-change layer 40 may be formed of, for example, a compound containing antimony (Sb) and tellurium (Te). The phase-change layer 40 may be formed of, for example, a compound containing at least one element selected from the group consisting of germanium (Ge), silicon (Si), tin (Sn), phosphorus (P), antimony (Sb), aluminum (Al), gallium (Ga), indium (In), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), ruthenium (Ru), cadmium (Cd), hafnium (Hf), and tantalum (Ta), antimony (Sb), and tellurium (Te). The phase-change layer 40 may be formed of, for example, an Sb—Te compound containing at least one of the above elements.

The phase-change layer 40 may be formed of, for example, a compound containing germanium (Ge), antimony (Sb), and tellurium (Te). The phase-change layer 40 may be formed of, for example, GeTe—$Sb_2Te_3$ pseudobinary compound. The phase-change layer 40 may be formed of, for example, $Ge_2Sb_2Te_5$ or $Ge_2SbTe_2$.

The phase-change layer 40 may be formed of, for example, a compound containing indium (In), germanium (Ge), and tellurium (Te). The phase-change layer 40 may be formed of, for example, an In—Ge—Te compound.

The phase-change layer 40 may be formed of, for example, a compound containing silicon (Si), antimony (Sb), and tellurium (Te). The phase-change layer 40 may be formed of, for example, an Si—Sb—Te compound.

The phase-change layer 40 can be formed by atomic layer deposition (ALD), for example.

The operational effects of the memory device according to the first embodiment will be described below.

In the resistance-change type memory which changes the conductivity of the variable resistance layer 30 using a change in the oxygen deficiency amount, a specific memory cell may break down due to the repetition of the set operation and the reset operation resulting in the memory operation being incapable of being executed, resulting in causing inferior reliability. When a specific memory cell breaks down, it is preferable to have a high resistance at the breakdown portion. This is because if the breakdown portion has a low resistance, a leakage current flowing in the breakdown portion causes a malfunction of other memory cells.

Figure 3:
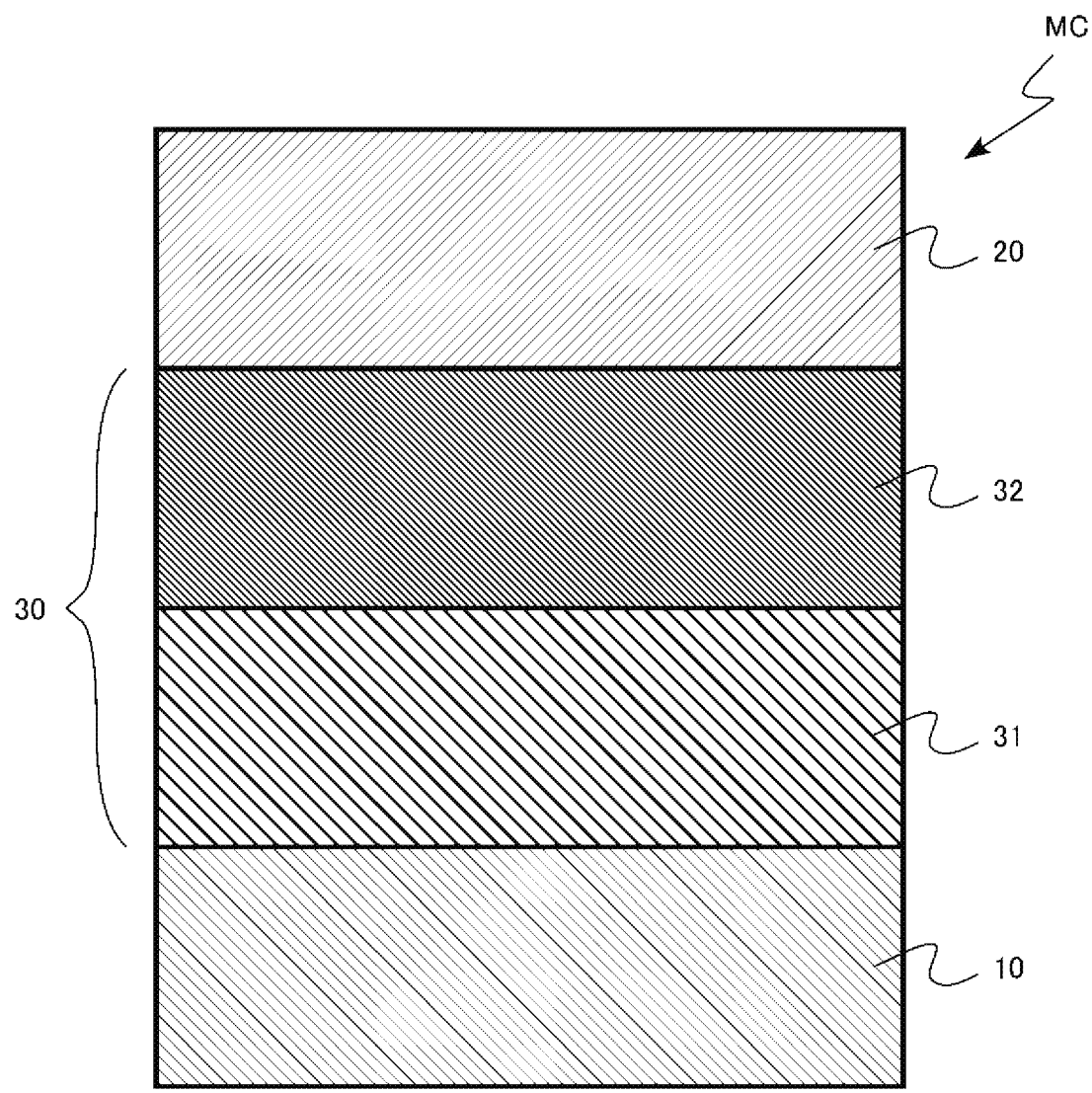
FIG. 3 is a schematic cross-sectional view of a memory cell of a memory device according to a comparative example.

FIG. 3 is a schematic cross-sectional view of a memory cell MC of a memory device according to a comparative example. The memory cell MC of the comparative example differs from the memory cell MC of the first embodiment in that the phase-change layer 40 is not provided.

Figure 4:
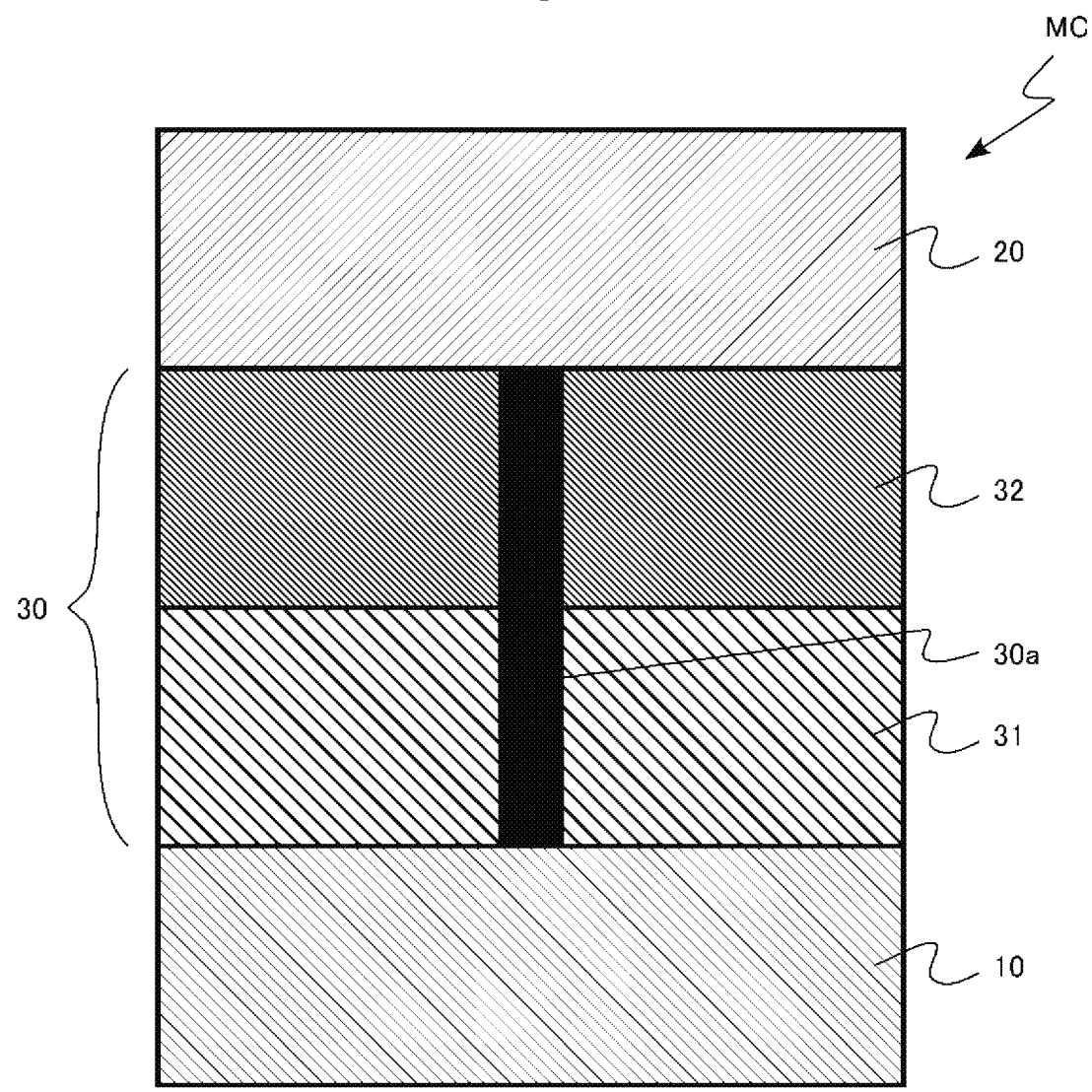
FIG. 4 is a view for describing problems of the memory device according to the comparative example.

FIG. 4 is a view for describing problems of the memory device according to the comparative embodiment. FIG. 4 is a schematic cross-section view of a specific memory cell MC in which breakdown occurs and reliability is inferior.

In the memory cell MC in which the breakdown occurs, it is considered that a low-resistance filament 30a is formed by voltages which are repeatedly applied. The breakdown portion becomes a low resistance at all times due to existence of the filament 30a, and thus the memory cell MC becomes defective. The filament 30a is created by, for example, a metal that has moved from an electrode, or oxygen deficiency.

For example, when a large leakage current flows in the filament 30a of the memory cell MC in which the breakdown has occurred, a malfunction such as erroneous writing or erroneous reading may occur in a memory cell MC connected to the word line WL or bit line BL to which the memory cell MC in which the breakdown has occurred is connected.

Figure 5:
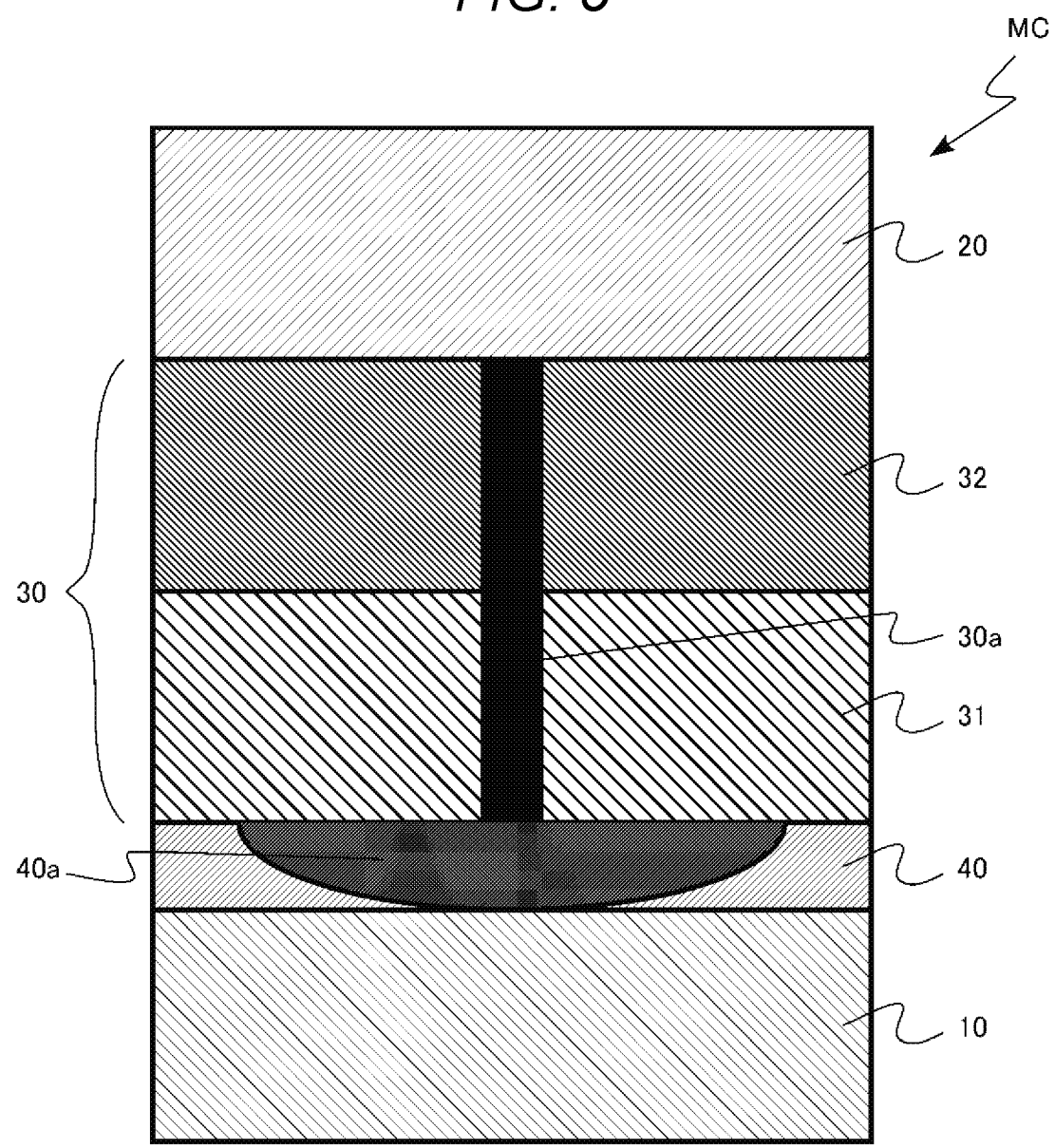
FIG. 5 is a view for describing operational effects of the memory device according to the first embodiment.

FIG. 5 is a view for describing operational effects of the memory device according to the first embodiment. FIG. 5 is a schematic cross-sectional view of a specific memory cell MC in which breakdown occurs and reliability is inferior. In the memory device according to the first embodiment, the phase-change layer 40 is provided between the lower electrode 10 and the high resistance layer 31.

In the memory cell MC in which the breakdown occurs, similarly to the case of the comparative embodiment, the low-resistance filament 30a is formed. At the moment when the low-resistance filament 30a is formed, it is considered that a large volume of current flows through the filament 30a and a large amount of Joule heat is locally generated. There is a possibility that a temperature of the breakdown portion will be 700° C. or higher.

The high-temperature phase-change layer 40 is melted and changes from a polycrystalline phase into an amorphous phase 40a. The amorphous phase 40a has a high resistance. Accordingly, it is possible to make the breakdown portion of the memory cell MC with a high resistance. Therefore, the leakage current is prevented from flowing in the memory cell MC in which the breakdown has occurred, thereby preventing the malfunction of the memory cell MC connected to the word line WL or bit line BL to which the memory cell MC in which the breakdown has occurred is connected.

In the memory cell MC in which the breakdown has occurred, there can also be a current path through which a current flows in the polycrystalline phase of the high resistance layer 31 and the phase-change layer 40 by detouring around the high-resistance amorphous phase 40a. However, since the resistivity of the high resistance layer 31 is high, a large volume of leakage current does not flow through the current path.

From the viewpoint of the ease of film formation, the stability of film, and the optimization of the resistance value of the variable resistance layer 30, the high resistance layer 31 is preferably formed of amorphous silicon.

From the viewpoint of the ease of film formation, the stability of film, and the increase in the resistance ratio between the high resistance state and the low resistance state of the variable resistance layer 30, the low resistance layer 32 is preferably formed of titanium oxide.

According to the first embodiment, it is possible to make the breakdown portion of the memory cell MC with high resistance. Accordingly, the malfunction of the memory cell MC is prevented.

Second Embodiment

A memory device of a second embodiment differs from that of the first embodiment in that the phase-change layer is provided between the second conductive layer and the variable resistance layer. The description will not be made with respect to the same contents as those of the first embodiment.

Figure 6:
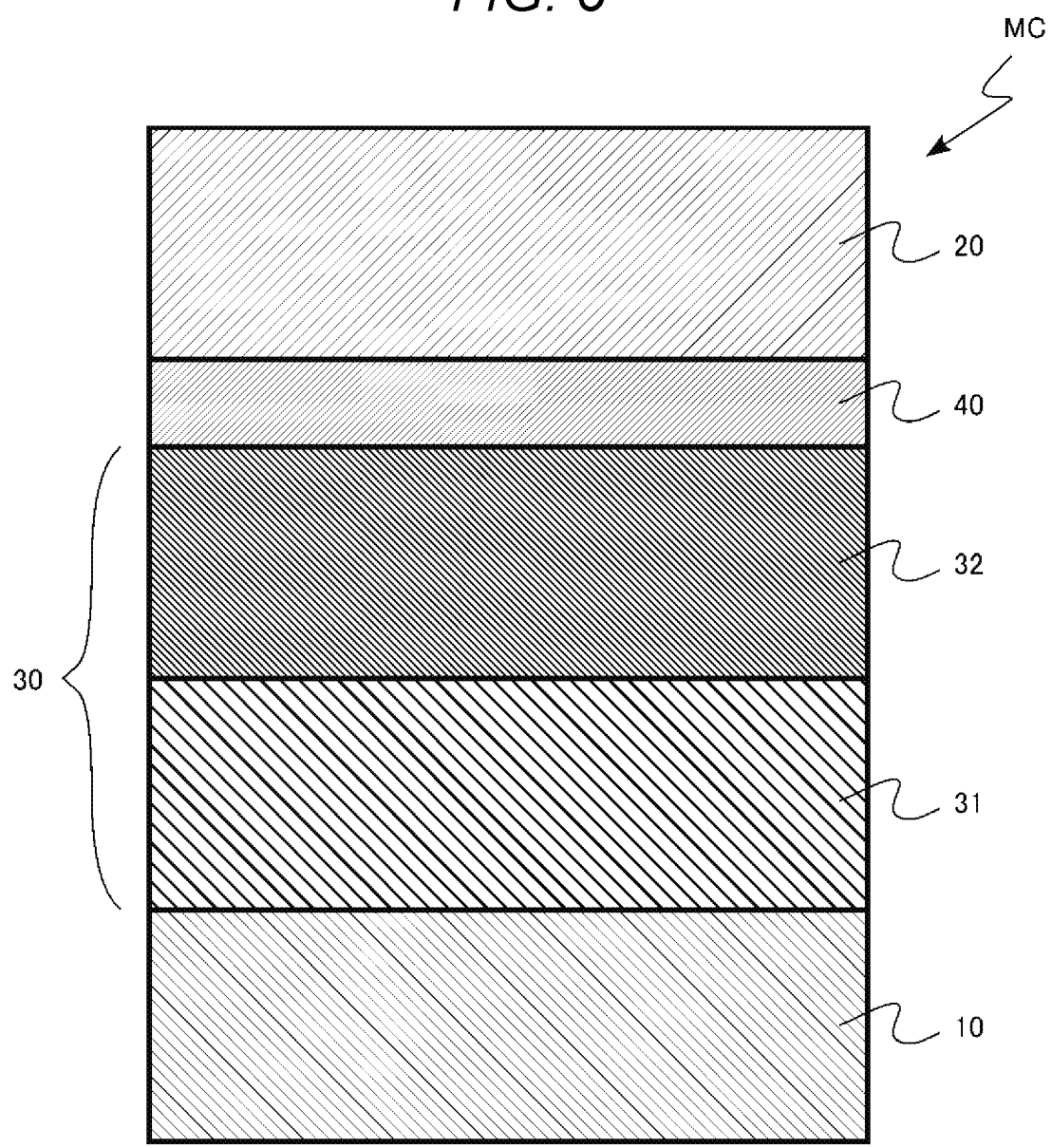
FIG. 6 is a schematic cross-sectional view of a memory cell of a memory device according to a second embodiment.

FIG. 6 is a schematic cross-sectional view of a memory cell MC of the memory device according to the second embodiment.

As illustrated in FIG. 6, the memory cell MC includes a lower electrode 10 (first conductive layer), an upper electrode 20 (second conductive layer), a variable resistance layer 30, and a phase-change layer 40. The variable resistance layer 30 includes a high resistance layer 31 (first layer) and a low resistance layer 32 (second layer). From the lower electrode 10 toward the upper electrode 20, the high resistance layer 31, the low resistance layer 32, and the phase-change layer 40 are arranged in order.

The phase-change layer 40 is provided between the upper electrode 20 (second conductive layer) and the variable resistance layer 30. The phase-change layer 40 is provided between the upper electrode 20 and the low resistance layer 32.

The phase-change layer 40 is a polycrystalline layer. The phase-change layer 40 has, for example, a characteristic that it becomes an amorphous state by heating at 700° C. or lower and rapid cooling to increase the resistivity. The phase-change layer 40 has a characteristic that the phase thereof changes into an amorphous phase of a high resistance from a polycrystalline phase of a low resistance by heating and rapid cooling.

According to the second embodiment, it is possible to make the breakdown portion of the memory cell MC with high resistance as in the first embodiment. Accordingly, the malfunction of the memory cell MC is prevented.

Third Embodiment

A memory device according to a third embodiment includes: a first conductive layer; a second conductive layer; a variable resistance layer that is provided between the first conductive layer and the second conductive layer and includes a first layer containing a semiconductor or a first metal oxide and a second layer containing a second metal oxide; and a metal layer that is provided between the first conductive layer and the variable resistance layer and has a melting point of 700° C. or lower.

The memory device of the third embodiment is similar to that of the first embodiment except that the metal layer is provided instead of the phase-change layer. Some description will not be made with respect to the same contents as those of the first embodiment.

Figure 7:
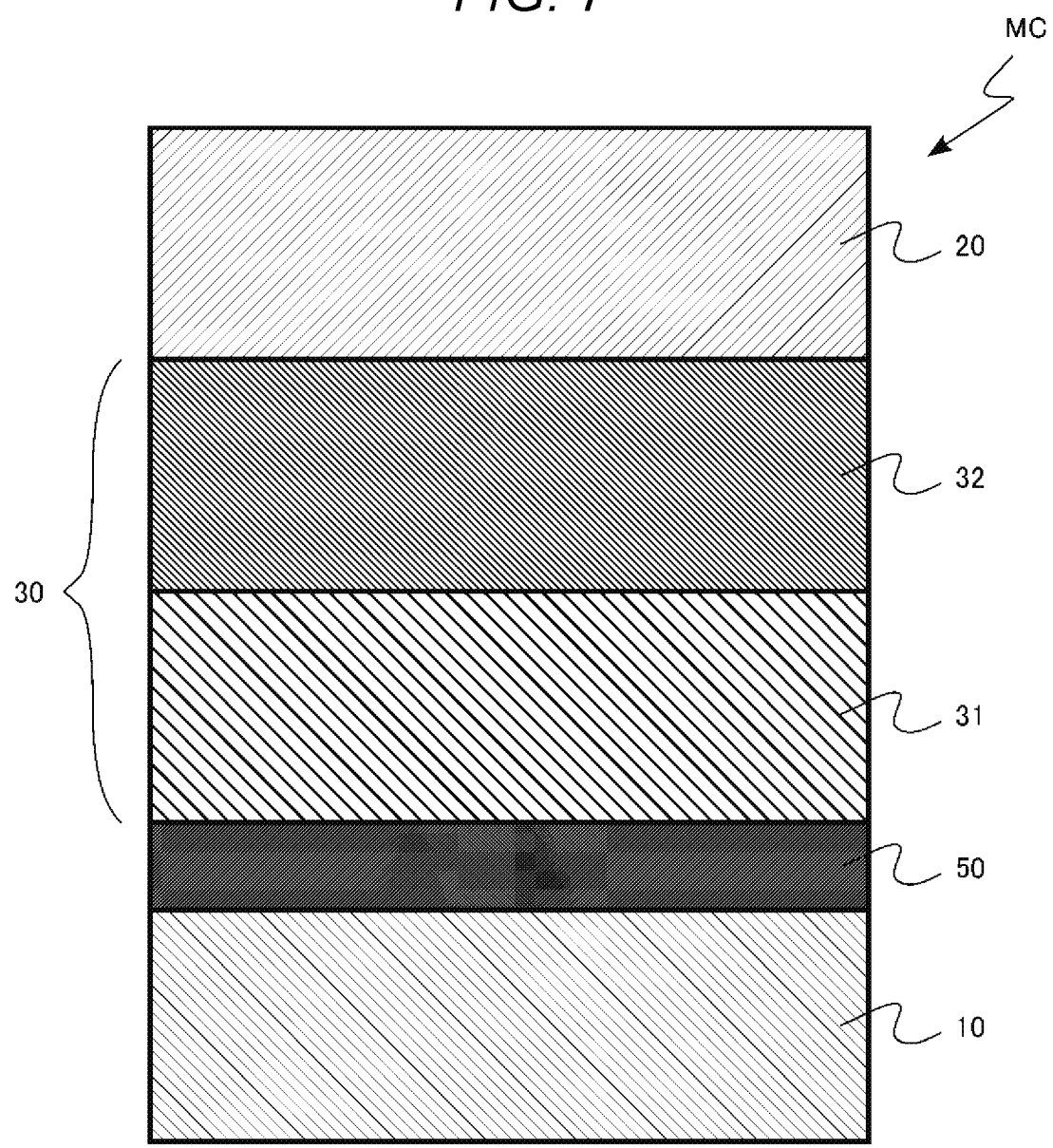
FIG. 7 is a schematic cross-sectional view of a memory cell of a memory device according to a third embodiment.

FIG. 7 is a schematic cross-sectional view of a memory cell MC of the memory device according to the third embodiment.

As illustrated in FIG. 7, the memory cell MC includes a lower electrode 10 (first conductive layer), an upper electrode 20 (second conductive layer), a variable resistance layer 30, and a metal layer 50. The variable resistance layer 30 includes a high resistance layer 31 (first layer) and a low resistance layer 32 (second layer). From the lower electrode 10 toward the upper electrode 20, the metal layer 50, the high resistance layer 31, and the low resistance layer 32 are arranged in order.

The metal layer 50 is provided between the lower electrode 10 (first conductive layer) and the variable resistance layer 30. The metal layer 50 is provided between the lower electrode 10 and the high resistance layer 31. The metal layer 50 has a melting point of 700° C. or lower.

The metal layer 50 is formed of, for example, aluminum (Al), zinc (Zn), tin (Sn), magnesium (Mg), or lead (Pb). The metal layer 50 can be formed by ALD or chemical vapor deposition (CVD), for example.

Figure 8:
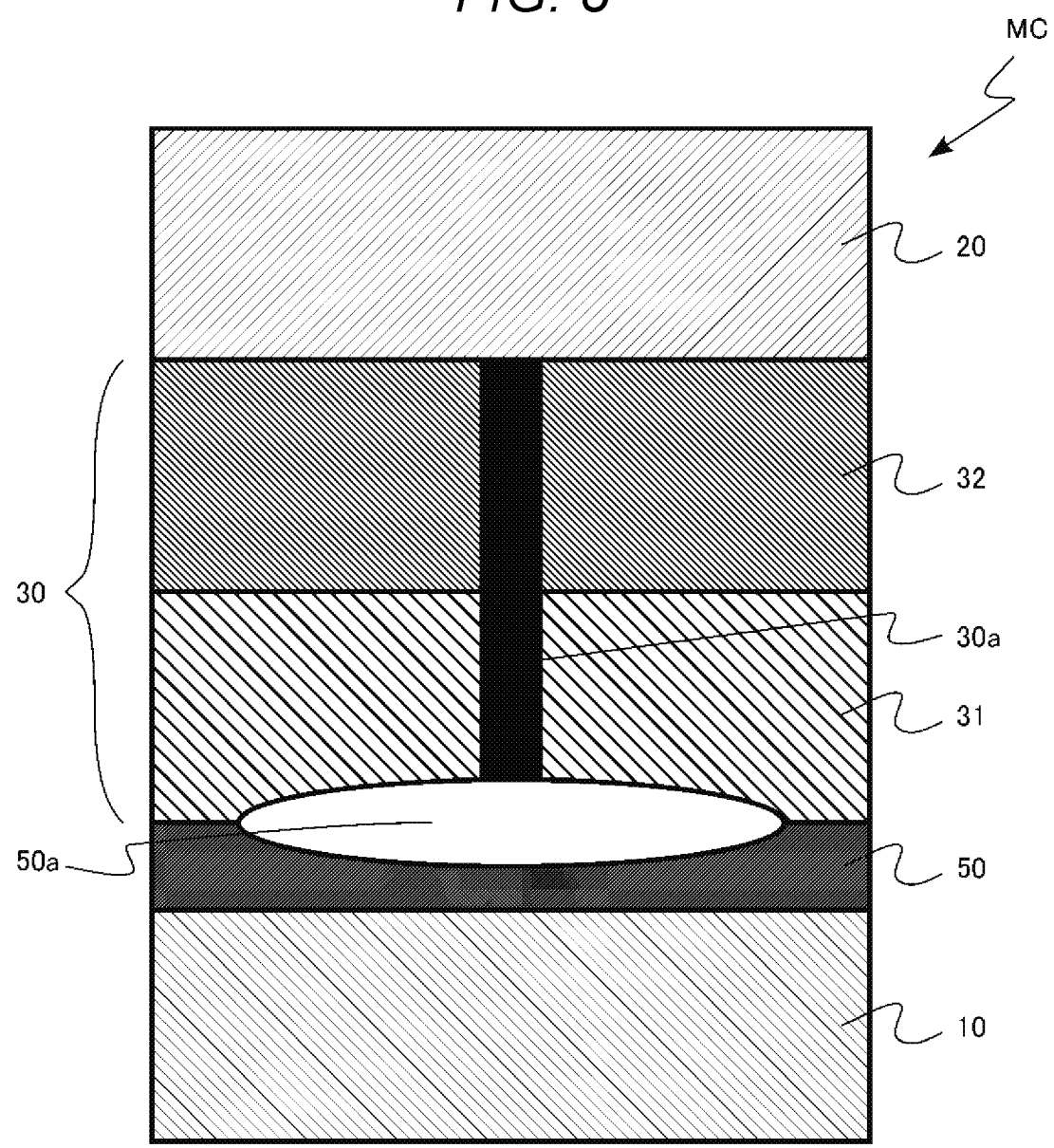
FIG. 8 is a view for describing operational effects of the memory device according to the third embodiment.

FIG. 8 is a view for describing operational effects of the third embodiment. FIG. 8 is a schematic cross-sectional view of a specific memory cell MC in which breakdown occurs and reliability is inferior.

In the memory cell MC in which the breakdown occurs, it is considered that the low-resistance filament 30a is formed. At the moment when the low-resistance filament 30a is formed, it is considered that a large volume of current flows through the filament 30a and a large amount of Joule heat is locally generated. There is a possibility that a temperature of the breakdown portion will be 700° C. or higher.

The high-temperature metal layer 50 is melted when reaching the melting point to form a void (cavity) 50a by rapid cooling. This is because the metal layer 50 expands in volume due to the melting and the volume is reduced in solidification. For example, when the metal layer 50 is formed of aluminum, the volume thereof is reduced by about 12%.

The void 50a has a high resistance. Accordingly, it is possible to make the breakdown portion of the memory cell MC with high resistance. Therefore, the leakage current is prevented from flowing in the memory cell MC in which the breakdown has occurred, thereby preventing the malfunction of the memory cell MC connected to the word line WL or bit line BL to which the memory cell MC in which the breakdown has occurred is connected.

There can also be a current path through which a current flows in the high resistance layer 31 and the metal layer 50 by detouring around the high-resistance void 50a. However, since the resistivity of the high resistance layer 31 is high, a large volume of leakage current does not flow through the current path.

According to the third embodiment, it is possible to make the breakdown portion of the memory cell MC with high resistance. Accordingly, the malfunction of the memory cell MC is prevented.

Fourth Embodiment

A memory device of a fourth embodiment differs from that of the third embodiment in that the metal layer is provided between the second conductive layer and the variable resistance layer. Some description will not be made with respect to the same contents as those of the third embodiment.

Figure 9:
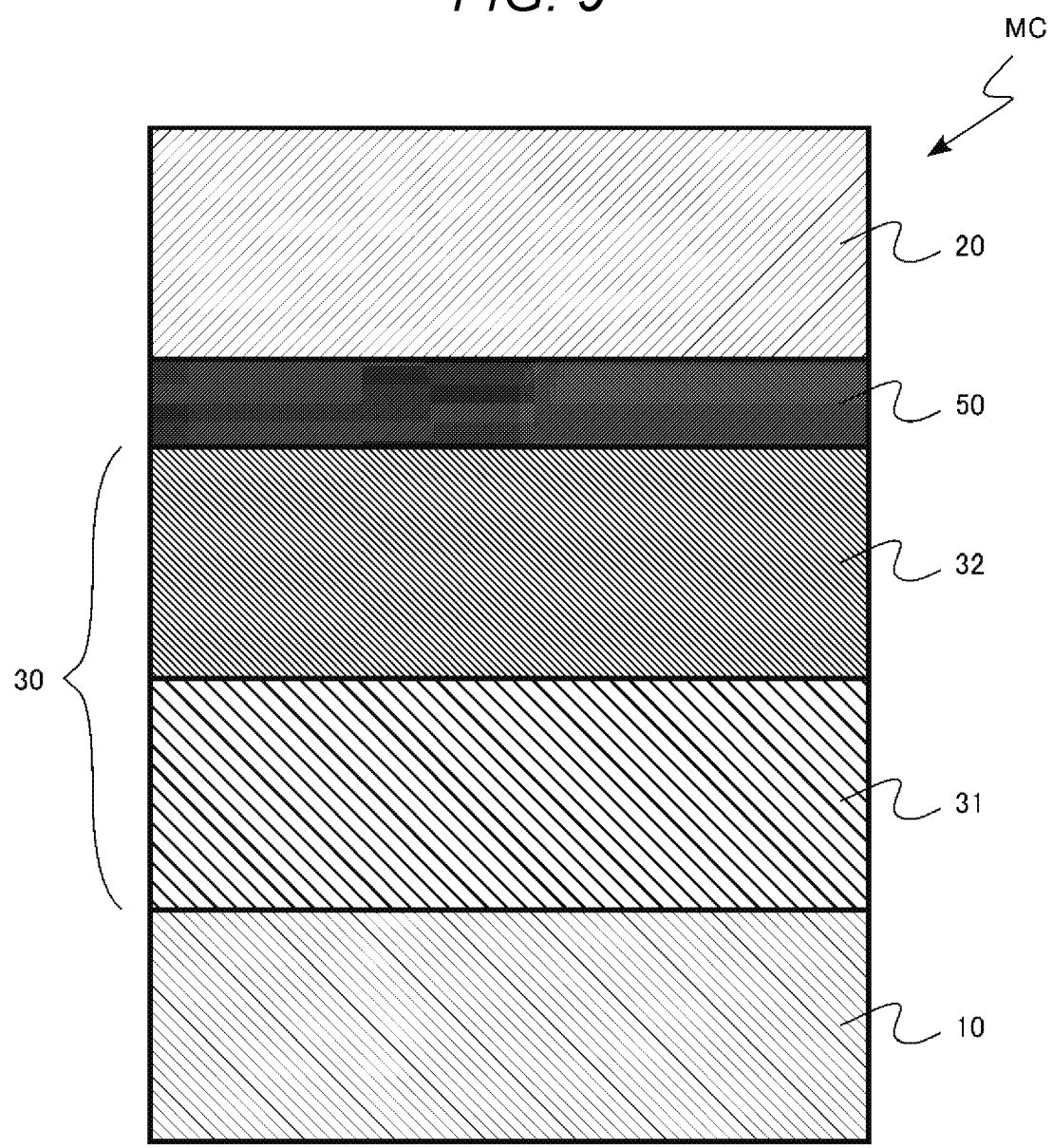
FIG. 9 is a schematic cross-sectional view of a memory cell of a memory device according to a fourth embodiment.

FIG. 9 is a schematic cross-sectional view of a memory cell MC of the memory device according to the fourth embodiment.

As illustrated in FIG. 9, the memory cell MC includes a lower electrode 10 (first conductive layer), an upper electrode 20 (second conductive layer), a variable resistance layer 30, and a metal layer 50. The variable resistance layer 30 includes a high resistance layer 31 (first layer) and a low resistance layer 32 (second layer). From the lower electrode 10 toward the upper electrode 20, the high resistance layer 31, the low resistance layer 32, and the metal layer 50 are arranged in order.

The metal layer 50 is provided between the upper electrode 20 (second conductive layer) and the variable resistance layer 30. The metal layer 50 is provided between the upper electrode 20 and the low resistance layer 32. The metal layer 50 has a melting point of 700° C. or lower.

According to the fourth embodiment, it is possible to make the breakdown portion of the memory cell MC with high resistance as in the third embodiment. Accordingly, the malfunction of the memory cell MC is prevented.

Fifth Embodiment

A memory device according to a fifth embodiment includes: a first conductive layer; a second conductive layer; a variable resistance layer that is provided between the first conductive layer and the second conductive layer and includes a first layer containing a semiconductor and a second layer containing a metal oxide; and a metal layer that is provided either between the first conductive layer and the variable resistance layer or between the second conductive layer and the variable resistance layer, is in contact with the first layer, and is formed of one metal selected from the group consisting of titanium (Ti), nickel (Ni), cobalt (Co), tantalum (Ta), molybdenum (Mo), platinum (Pt), and tungsten (W).

The memory device of the fifth embodiment is similar to that of the first embodiment except that the metal layer is provided instead of the phase-change layer. The description will not be made with respect to the same contents as those of the first embodiment.

Figure 10:
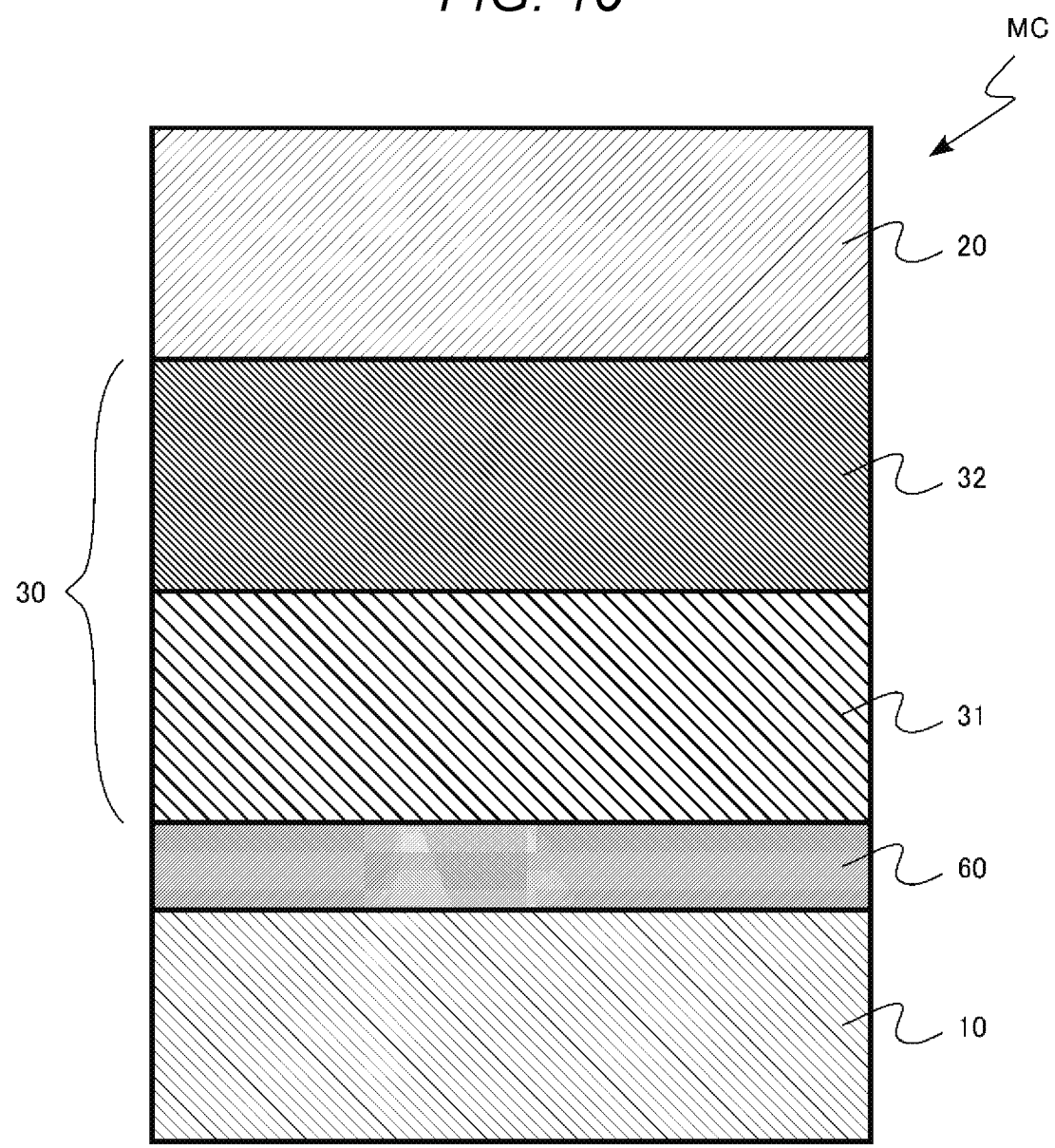
FIG. 10 is a schematic cross-sectional view of a memory cell of a memory device according to a fifth embodiment.

FIG. 10 is a schematic cross-sectional view of a memory cell MC of the memory device according to the fifth embodiment.

As illustrated in FIG. 10, the memory cell MC includes a lower electrode 10 (first conductive layer), an upper electrode 20 (second conductive layer), a variable resistance layer 30, and a metal layer 60. The variable resistance layer 30 includes a high resistance layer 31 (first layer) and a low resistance layer 32 (second layer). From the lower electrode 10 toward the upper electrode 20, the metal layer 60, the high resistance layer 31, and the low resistance layer 32 are arranged in order.

The metal layer 60 is provided between the lower electrode 10 (first conductive layer) and the variable resistance layer 30. The metal layer 60 is provided between the lower electrode 10 and the high resistance layer 31. The metal layer 60 is in contact with the high resistance layer 31 (first layer).

The metal layer 60 is formed of one metal selected from the group consisting of titanium (Ti), nickel (Ni), cobalt (Co), tantalum (Ta), molybdenum (Mo), platinum (Pt), zirconium (Zr), hafnium (Hf), copper (Cu), and tungsten (W). The metal forms a metal semiconductor compound at a temperature of 700° C. or lower. The metal layer 50 can be formed by ALD or chemical vapor deposition (CVD), for example.

Figure 11:
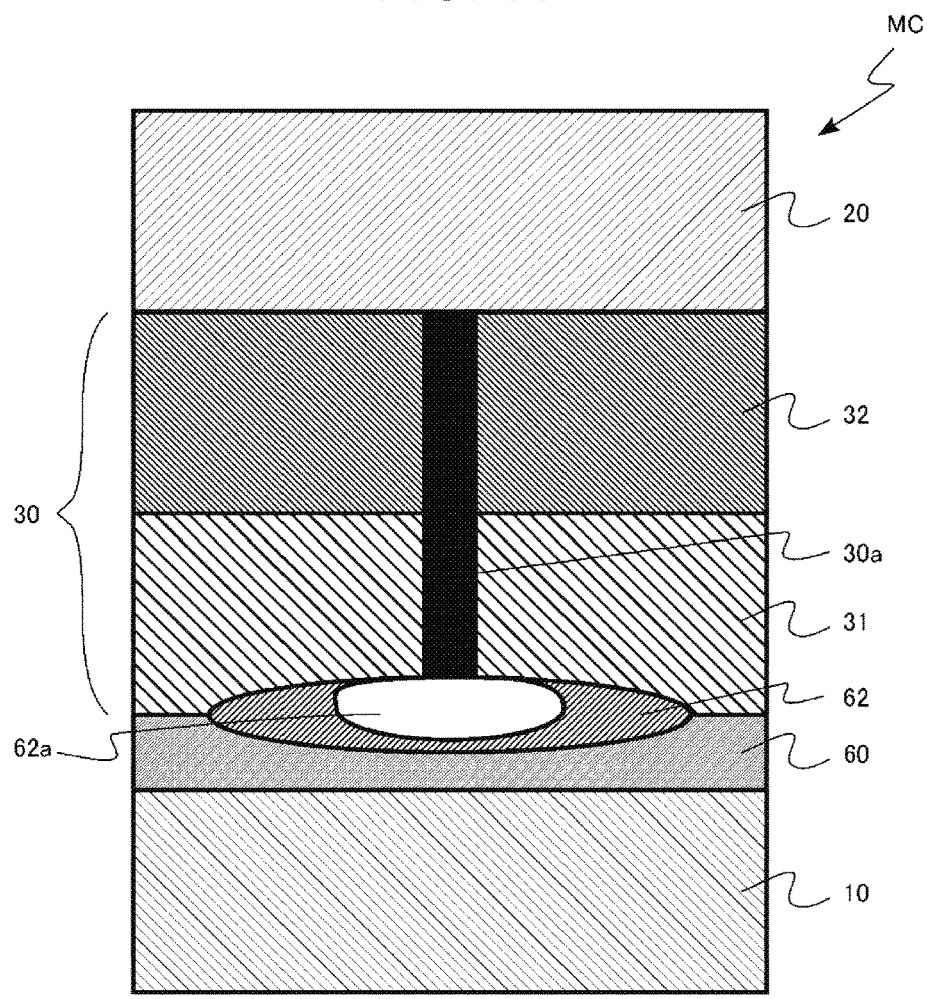
FIG. 11 is a view for describing operational effects of the memory device according to the fifth embodiment.

FIG. 11 is a view for describing operational effects of the fifth embodiment. FIG. 11 is a schematic cross-sectional view of a specific memory cell MC in which breakdown occurs and reliability is inferior.

In the memory cell MC in which the breakdown occurs, it is considered that the low-resistance filament 30a is formed. At the moment when the low-resistance filament 30a is formed, it is considered that a large volume of current flows through the filament 30a and a large amount of Joule heat is locally generated. There is a possibility that a temperature of the breakdown portion will be 700° C. or higher.

The high-temperature metal layer 60 reacts with the semiconductor of the high resistance layer 31, thereby forming a metal semiconductor compound 62. When the metal semiconductor compound 62 is formed, a void (cavity) 62a is formed. This is because the volume of the metal semiconductor compound 62 is smaller than the volume of the metal layer 60 and the semiconductor of the high resistance layer 31.

For example, when the metal layer 60 is formed of titanium (Ti) and the high resistance layer 31 is formed of amorphous silicon, titanium silicide ($TiSi_2$) is formed which causes a reduction in volume of about 26%.

The void 62a has a high resistance. Accordingly, it is possible to make the breakdown portion of the memory cell MC with a high resistance. Therefore, the leakage current is prevented from flowing in the memory cell MC in which the breakdown has occurred, thereby preventing a malfunction of the memory cell MC connected to the word line WL, or bit line BL to which the memory cell MC in which the breakdown has occurred is connected.

According to the fifth embodiment, it is possible to make the breakdown portion of the memory cell MC with a high resistance. Accordingly, a malfunction of the memory cell MC is prevented.

Sixth Embodiment

A memory device of a sixth embodiment differs from that of the first embodiment in that the memory cell array has a three-dimensional structure. Therefore, some description will not be made with respect to the same contents as those of the first embodiment.

Figure 12:
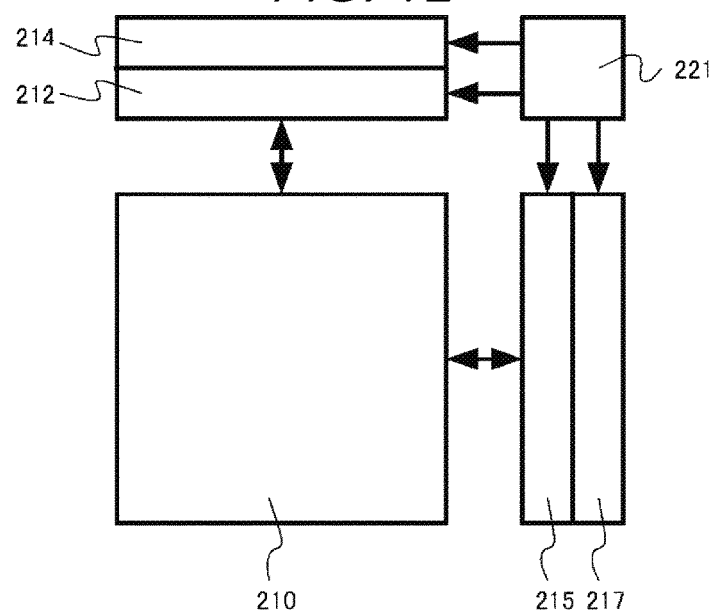
FIG. 12 is a block diagram of a memory device according to a sixth embodiment.
Figure 13:
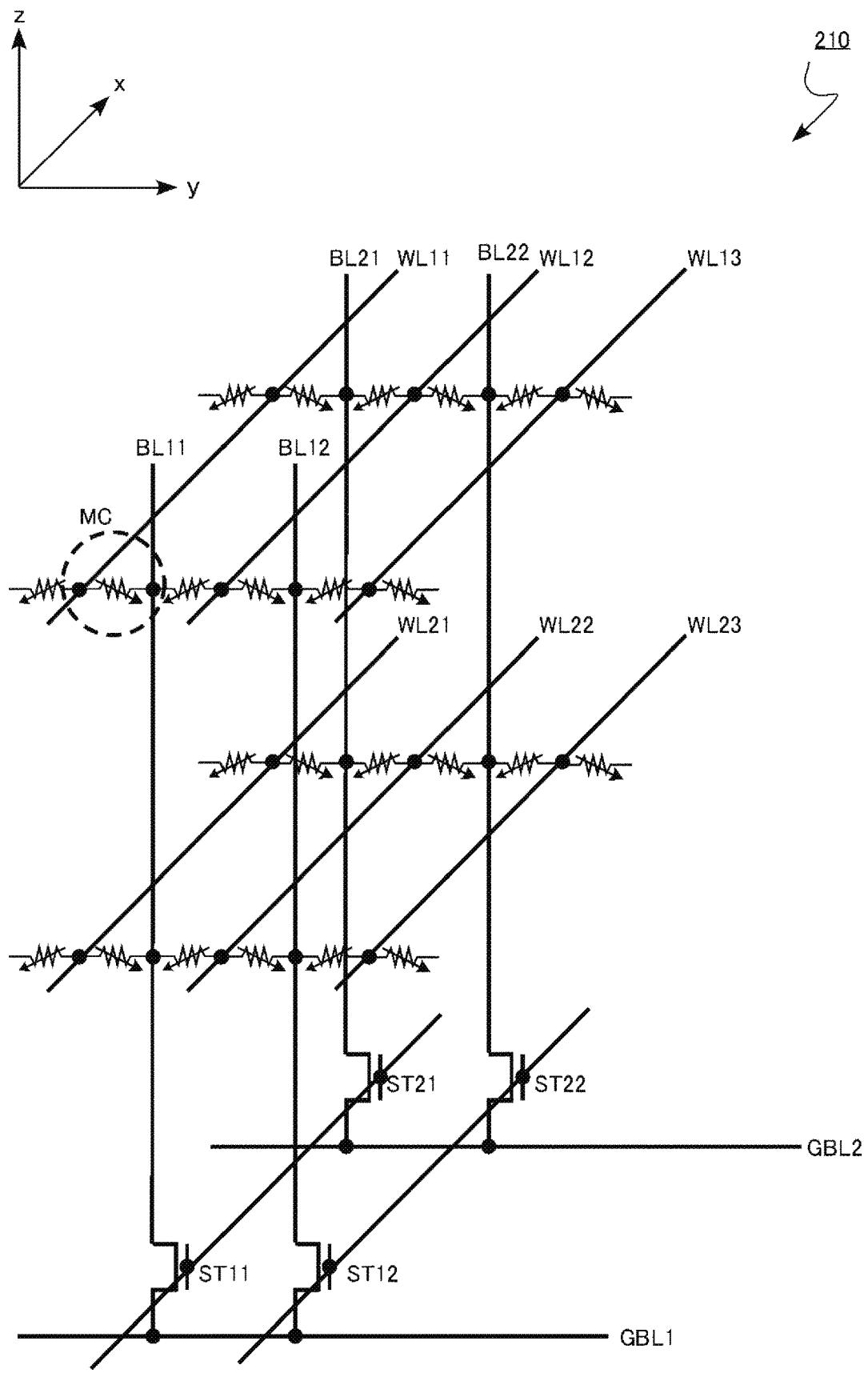
FIG. 13 is an equivalent circuit diagram of a memory cell array of the memory device according to the sixth embodiment.

FIG. 12 is a block diagram of the memory device according to the sixth embodiment. FIG. 13 is an equivalent circuit diagram of a memory cell array of the memory device according to the sixth embodiment. The memory cell array of the sixth embodiment has a three-dimensional structure in which memory cells MCs are three-dimensionally arranged. The memory device according to the sixth embodiment is a resistance-change type memory. The memory cell MC is a two-terminal resistance-variable element.

As illustrated in FIG. 12, the memory device includes a memory cell array 210, a word line driver circuit 212, a row decoder circuit 214, a sense amplifier 215, a column decoder circuit 217, and a control circuit 221.

As illustrated in FIG. 13, the plurality of memory cells MCs is three-dimensionally arranged in the memory cell array 210. In FIG. 13, a region surrounded by a broken line corresponds to one memory cell MC.

The memory cell array 210 may include, for example, a plurality of word lines WLs (WL11, WL12, WL13, WL21, WL22, and WL23) and a plurality of bit lines BLs (BL11, BL12, BL21, and BL22). The word lines WLs extend in an x-direction. The bit lines BLs extend in a z-direction. The word lines WLs and the bit lines BLs vertically intersect with each other. The memory cells MCs are arranged at intersections of the word lines WLs and the bit lines BLs.

The plurality of word lines WLs is electrically connected to the row decoder circuit 214. The plurality of bit lines BLs is connected to the sense amplifier 215. Between the plurality of bit lines BLs and the sense amplifier 215, select transistors STs (ST11, ST21, ST12, and ST22) and global bit lines GBLs (GBL1 and GBL2) are provided.

The row decoder circuit 214 has a function of selecting the word line WL according to the input row address signal. The word line driver circuit 212 has a function of applying a predetermined voltage to the word line WL selected by the row decoder circuit 214.

The column decoder circuit 217 has a function of selecting the bit line BL according to the input column address signal. The sense amplifier 215 has a function of applying a predetermined voltage to the bit line BL selected by the column decoder circuit 217. Further, the sense amplifier 215 has a function of detecting and amplifying a current flowing between the selected word line WL and the selected bit line BL.

The control circuit 221 has a function of controlling the word line driver circuit 212, the row decoder circuit 214, the sense amplifier 215, the column decoder circuit 217, and other circuits (not illustrated).

The circuits, for example, the word line driver circuit 212, the row decoder circuit 214, the sense amplifier 215, the column decoder circuit 217, and the control circuit 221, may be configured with, for example, a transistor and an interconnection layer using a semiconductor layer (not illustrated).

Figure 14:
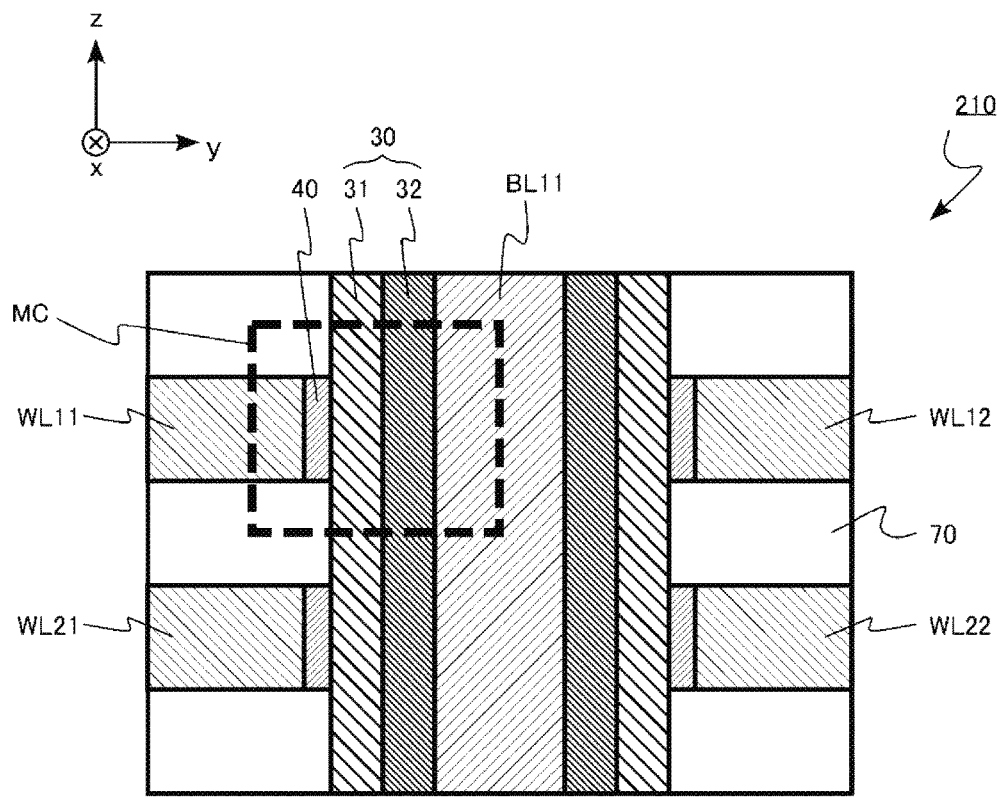
FIG. 14 is a schematic cross-sectional view of the memory cell array of the memory device according to the sixth embodiment.

FIG. 14 is a schematic cross-sectional view of the memory cell array 210 of the memory device according to the sixth embodiment. FIG. 14 is a cross-section view of the memory cell array 210 taken along a y-z direction. In FIG. 14, a region surrounded by a broken line corresponds to one memory cell MC.

The memory cell array 210 includes a word line WL11 (first conductive layer), a word line WL12, a word line WL21, a word line WL22, a bit line BL11 (second conductive layer), a variable resistance layer 30, a phase-change layer 40, and an interlayer insulating layer 70. The variable resistance layer 30 includes a high resistance layer 31 (first layer) and a low resistance layer 32 (second layer). From the word line WL11 toward the bit line BL11, the phase-change layer 40, the high resistance layer 31, and the low resistance layer 32 are arranged in order.

The phase-change layer 40 may be a polycrystalline layer. The phase-change layer 40 may have, for example, a characteristic where it enters an amorphous state by heating at 700° C. or lower and rapid cooling to increase the resistivity. The phase-change layer 40 has a characteristic that the phase thereof changes into an amorphous phase of a high resistance from a polycrystalline phase of a low resistance by heating and rapid cooling.

The phase-change layer 40 may be formed of, for example, a compound containing chalcogen (Group XVI element). The phase-change layer 40 may be formed of, for example, a compound containing germanium (Ge), antimony (Sb), and tellurium (Te). The phase-change layer 40 may be formed of, for example, $Ge_2Sb_2Te_5$.

According to the sixth embodiment, the three-dimensional structure is provided, and thus the effect of improving the degree of integration of the memory device can be obtained in addition to the effect of the first embodiment.

Seventh Embodiment

A memory device of a seventh embodiment differs from that of the sixth embodiment in that the phase-change layer 40, the high resistance layer 31, and the low resistance layer 32 are arranged in a reverse order between the word line WL11 and the bit line BL11. Some description will not be made with respect to the same contents as those of the sixth embodiment.

Figure 15:
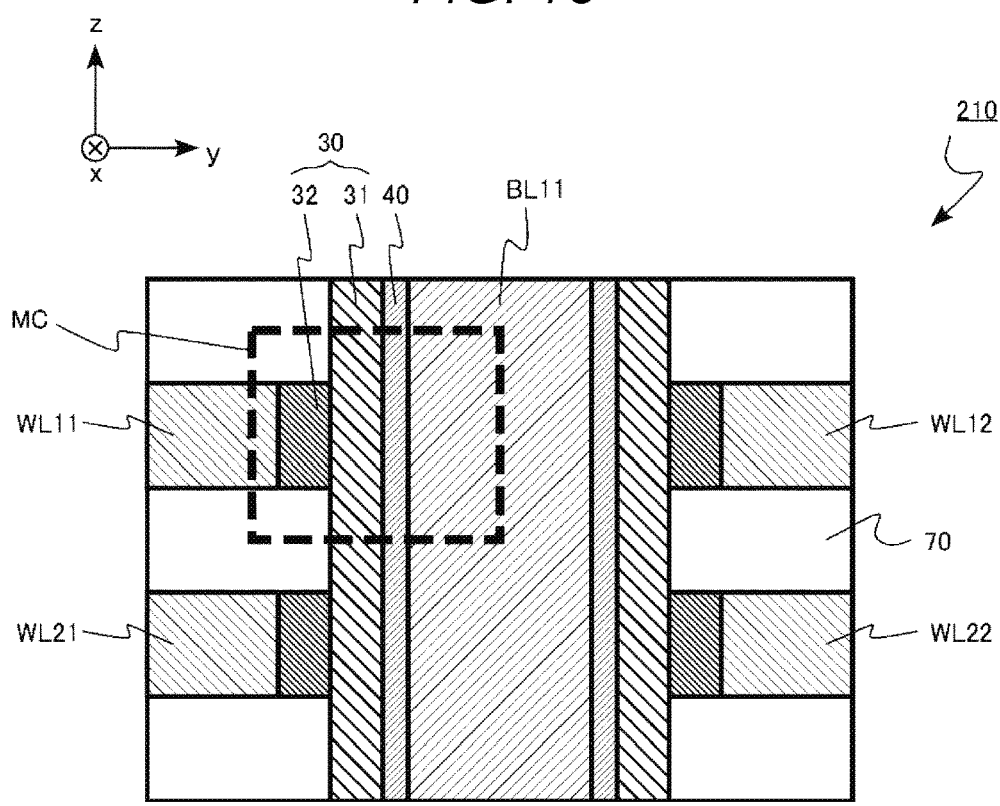
FIG. 15 is a schematic cross-sectional view of a memory cell array of a memory device according to a seventh embodiment.

FIG. 15 is a schematic cross-sectional view of a memory cell array 210 of a memory device according to the seventh embodiment. FIG. 15 is a cross-sectional view of the memory cell array 210 taken along a y-z direction. In FIG. 15, a region surrounded by a broken line corresponds to one memory cell MC.

The memory cell array 210 includes a word line WL11 (first conductive layer), a word line WL12, a word line WL21, a word line WL22, a bit line BL11 (second conductive layer), a variable resistance layer 30, a phase-change layer 40, and an interlayer insulating layer 70. The variable resistance layer 30 includes a high resistance layer 31 (first layer) and a low resistance layer 32 (second layer). From the word line WL11 toward the bit line BL11, the low resistance layer 32, the high resistance layer 31, and the phase-change layer 40 are arranged in order.

According to the seventh embodiment, the same effect as in the sixth embodiment can be obtained.

Eighth Embodiment

A memory device of an eighth embodiment differs from that of the third embodiment in that a memory cell array has a three-dimensional structure. Therefore, some description will not be made with respect to the same contents as those of the third embodiment. Further, the three-dimensional structure of the memory cell array is similar to that of the sixth embodiment. Accordingly, some description will not be made with respect to the same contents as those of the sixth embodiment.

Figure 16:
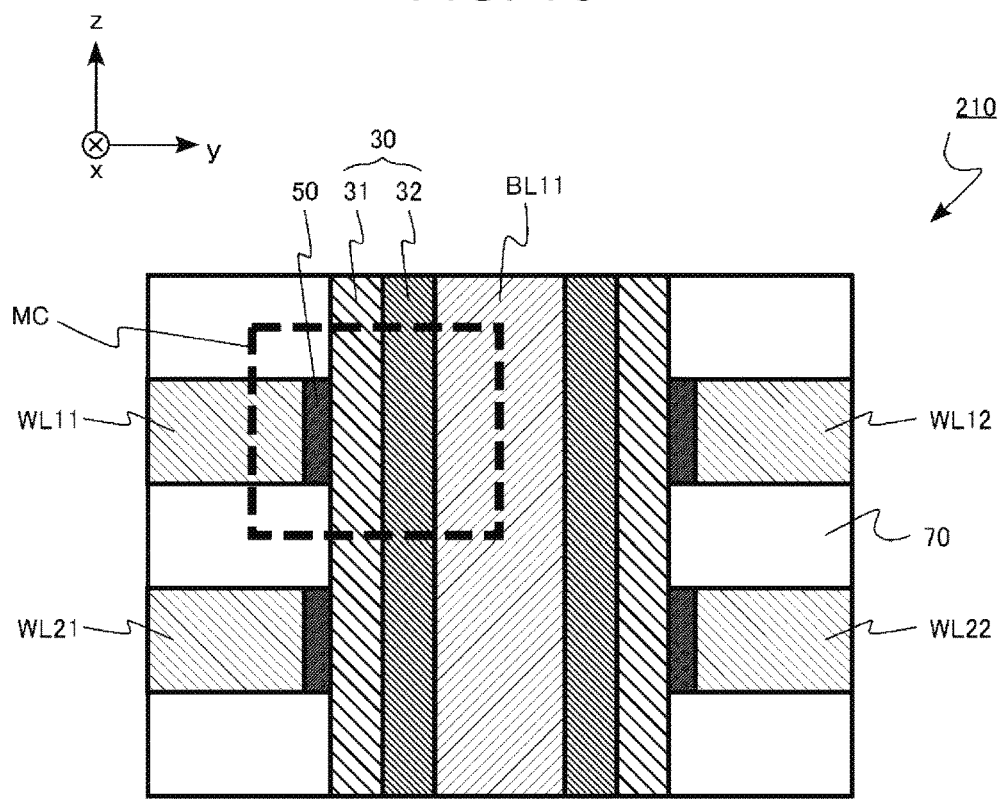
FIG. 16 is a schematic cross-sectional view of a memory cell array of a memory device according to an eighth embodiment.

FIG. 16 is a schematic cross-sectional view of a memory cell array 210 of the memory device according to the eighth embodiment. FIG. 16 is a cross-sectional view of the memory cell array 210 taken along a y-z direction. In FIG. 16, a region surrounded by a broken line corresponds to one memory cell MC.

The memory cell array 210 includes a word line WL11 (first conductive layer), a word line WL12, a word line WL21, a word line WL22, a bit line BL11 (second conductive layer), a variable resistance layer 30, a metal layer 50, and an interlayer insulating layer 70. The variable resistance layer 30 includes a high resistance layer 31 (first layer) and a low resistance layer 32 (second layer). From the word line WL11 toward the bit line BL11, the metal layer 50, the high resistance layer 31, and the low resistance layer 32 are arranged in order.

The metal layer 50 is provided between the word line WL11 and the variable resistance layer 30. The metal layer is provided between the word line WL11 and the high resistance layer 31. The metal layer 50 has a melting point of 700° C. or lower.

The metal layer 50 is formed of, for example, aluminum (Al), zinc (Zn), tin (Sn), or lead (Pb).

According to the eighth embodiment, the three-dimensional structure is provided, and thus the effect of improving the degree of integration of the memory device can be obtained in addition to the effect of the third embodiment.

Ninth Embodiment

A memory device of a ninth embodiment differs from that of the eighth embodiment in that the metal layer 50, the high resistance layer 31, and the low resistance layer 32 are arranged in a reverse order between the word line WL11 and the bit line BL11. Therefore, some description will not be made with respect to the same contents as those of the eighth embodiment.

Figure 17:
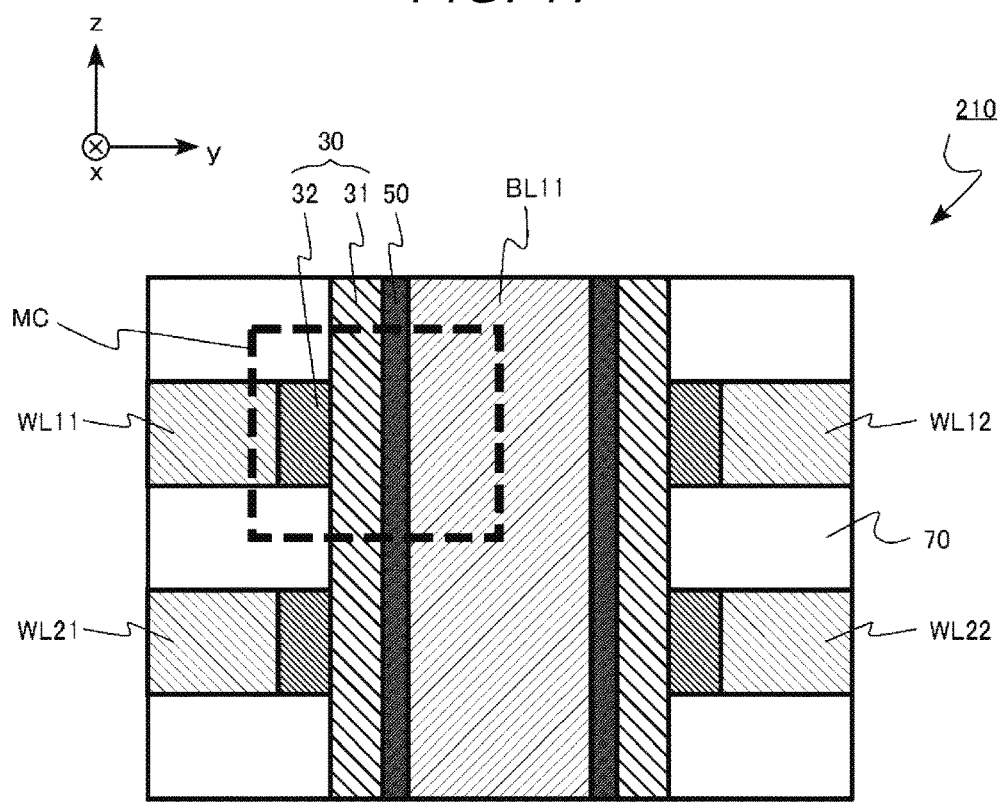
FIG. 17 is a schematic cross-sectional view of a memory cell array of a memory device according to a ninth embodiment.

FIG. 17 is a schematic cross-sectional view of a memory cell array 210 of the memory device according to the ninth embodiment. FIG. 17 is a cross-sectional view of the memory cell array 210 taken along a y-z direction. In FIG. 17, a region surrounded by a broken line corresponds to one memory cell MC.

The memory cell array 210 includes a word line WL11 (first conductive layer), a word line WL12, a word line WL21, a word line WL22, a bit line BL11 (second conductive layer), a variable resistance layer 30, a metal layer 50, and an interlayer insulating layer 70. The variable resistance layer 30 includes a high resistance layer 31 (first layer) and a low resistance layer 32 (second layer). From the word line WL11 toward the bit line BL11, the low resistance layer 32, the high resistance layer 31, and the metal layer 50 are arranged in order.

According to the ninth embodiment, the same effect as in the eighth embodiment can be obtained.

Tenth Embodiment

A memory device of a tenth embodiment differs from that of the fifth embodiment in that the memory cell array has a three-dimensional structure. Therefore, some description will not be made with respect to the same contents as those of the fifth embodiment. Further, the three-dimensional structure of the memory cell array is similar to that of the sixth embodiment. Therefore, some description will not be made with respect to the same contents as those of the sixth embodiment.

Figure 18:
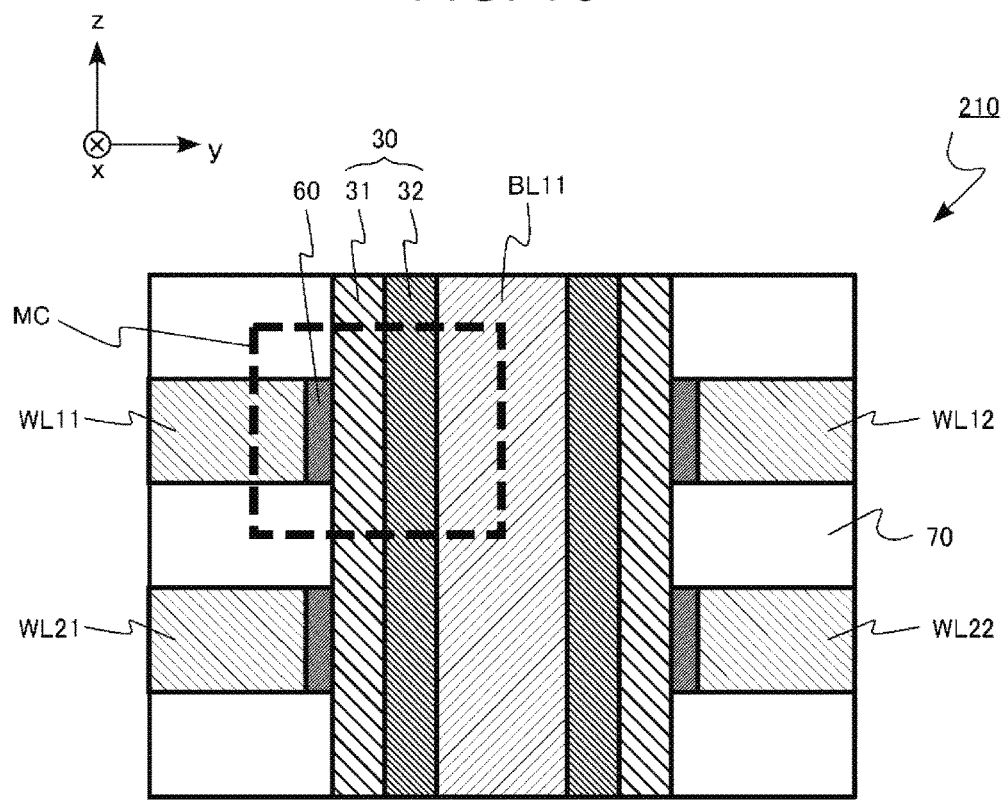
FIG. 18 is a schematic cross-sectional view of a memory cell array of a memory device according to a tenth embodiment.

FIG. 18 is a schematic cross-sectional view of a memory cell array 210 of the memory device according to the tenth embodiment. FIG. 18 is a cross-sectional view of the memory cell array 210 taken along a y-z direction. In FIG. 18, a region surrounded by a broken line corresponds to one memory cell MC.

The memory cell array 210 includes a word line WL11 (first conductive layer), a word line WL12, a word line WL21, a word line WL22, a bit line BL11 (second conductive layer), a variable resistance layer 30, a metal layer 60, and an interlayer insulating layer 70. The variable resistance layer 30 includes a high resistance layer 31 (first layer) and a low resistance layer 32 (second layer). From the word line WL11 toward the bit line BL11, the metal layer 60, the high resistance layer 31, and the low resistance layer 32 are arranged in order. The metal layer 60 is in contact with the high resistance layer 31.

The metal layer 60 is formed of one metal selected from the group consisting of titanium (Ti), nickel (Ni), cobalt (Co), tantalum (Ta), molybdenum (Mo), platinum (Pt), and tungsten (W). The metal forms a metal semiconductor compound at a temperature of 700° C. or lower.

According to the tenth embodiment, the three-dimensional structure is provided, and thus the effect of improving the degree of integration of the memory device can be obtained in addition to the effect of the fifth embodiment.

Eleventh Embodiment

A memory device of an eleventh embodiment differs from that of the tenth embodiment in that the metal layer 60, the high resistance layer 31, and the low resistance layer 32 are arranged in a reverse order between the word line WL11 and the bit line BL11. Therefore, some description will not be made with respect to the same contents as those of the tenth embodiment.

Figure 19:
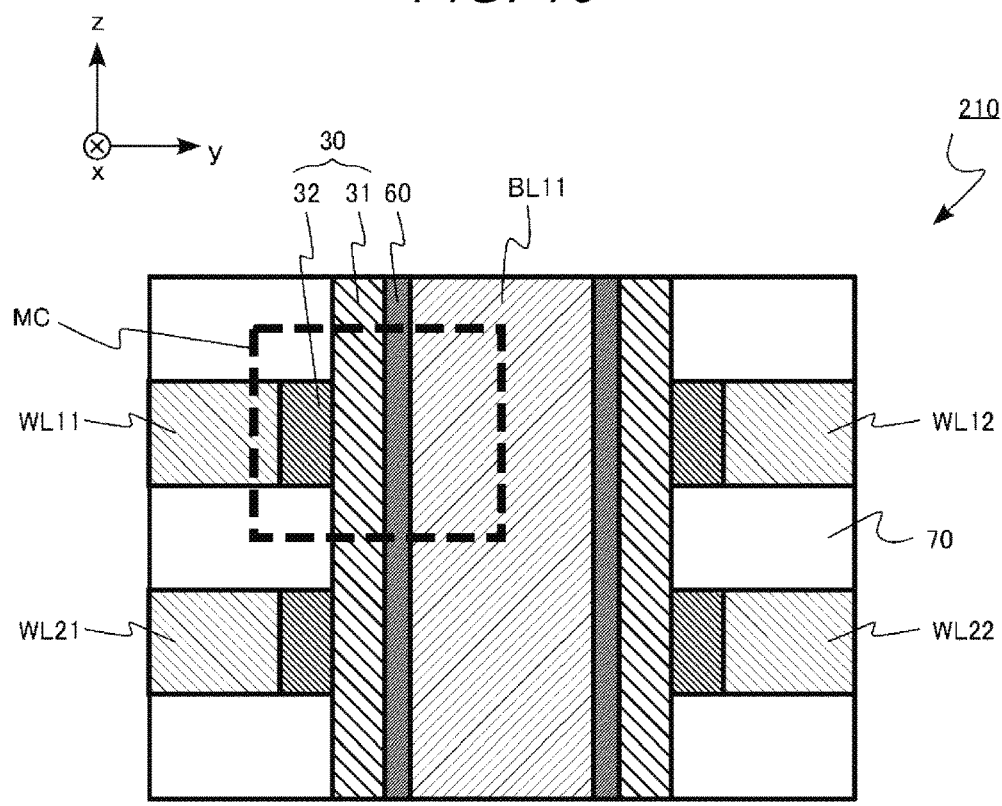
FIG. 19 is a schematic cross-sectional view of a memory cell array of a memory device according to an eleventh embodiment.

FIG. 19 is a schematic cross-sectional view of a memory cell array 210 of the memory device according to the eleventh embodiment. FIG. 19 is a cross-sectional view of the memory cell array 210 taken along a y-z direction. In FIG. 19, a region surrounded by a broken line corresponds to one memory cell MC.

The memory cell array 210 includes a word line WL11 (first conductive layer), a word line WL12, a word line WL21, a word line WL22, a bit line BL11 (second conductive layer), a variable resistance layer 30, a metal layer 60, and an interlayer insulating layer 70. The variable resistance layer 30 includes a high resistance layer 31 (first layer) and a low resistance layer 32 (second layer). From the word line WL11 toward the bit line BL11, the low resistance layer 32, the high resistance layer 31, and the metal layer 60 are arranged in order.

According to the eleventh embodiment, the same effect as in the tenth embodiment can be obtained.

In the first to eleventh embodiments, the case is described in which the phase-change layer 40, the metal layer 50, or the metal layer 60 is provided either between the first conductive layer and the variable resistance layer 30 or between the second conductive layer and the variable resistance layer 30. However, the phase-change layer 40, the metal layer 50, or the metal layer 60 may be provided both between the first conductive layer and the variable resistance layer 30 and between the second conductive layer and the variable resistance layer 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
    a first conductive layer;
    a second conductive layer;
    a variable resistance layer disposed between the first conductive layer and the second conductive layer, and including a first layer comprising a semiconductor or a first metal oxide, and a second layer comprising a second metal oxide; and
    a phase-change layer disposed between the first conductive layer and the second conductive layer, the phase-change layer being connected to (i) the first conductive layer and (ii) either the first layer of the variable resistance layer or the second layer of the variable resistance layer.

2. The memory device according to claim 1, wherein the phase-change layer is a phase-change layer disposed between the first conductive layer and the variable resistance layer,
    and the memory device further comprising a second phase-change layer disposed between the second conductive layer and the variable resistance layer.

3. The memory device according to claim 1,
wherein the second layer has a resitivity lower than a resitivity of the first layer, and
wherein the first layer is arranged between the first conductive layer and the second layer.

4. The memory device according to claim 1, wherein the first layer comprises an amorphous metal oxide and the second layer comprises a crystalline metal oxide.

5. The memory device according to claim 1, wherein the phase-change layer comprises a material having a property of entering an amorphous state by being heated to 700° C. or lower.

6. The memory device according to claim 1, wherein
the phase-change layer comprises a compound of germanium (Ge), tellurium (Te), and antimony (Sb).

* * * * *